United States Patent
Cheon et al.

(10) Patent No.: US 12,347,514 B2
(45) Date of Patent: Jul. 1, 2025

(54) STORAGE DEVICES DETECTING INTERNAL TEMPERATURE AND DEFECTS BY USING TEMPERATURE SENSORS AND METHODS OF OPERATING THE SAME

(71) Applicant: Samsung Electronics Co., Ltd., Suwon-si (KR)

(72) Inventors: Younsoo Cheon, Suwon-si (KR); Jihwa Lee, Suwon-si (KR); Kyungduk Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 222 days.

(21) Appl. No.: 18/204,972

(22) Filed: Jun. 2, 2023

(65) Prior Publication Data
US 2024/0055030 A1    Feb. 15, 2024

(30) Foreign Application Priority Data
Aug. 12, 2022    (KR) .................. 10-2022-0101588

(51) Int. Cl.
*G11C 7/04*    (2006.01)
*G11C 11/56*    (2006.01)

(52) U.S. Cl.
CPC ............ *G11C 7/04* (2013.01); *G11C 11/5628* (2013.01); *G11C 11/5642* (2013.01)

(58) Field of Classification Search
CPC ... G11C 7/04; G11C 11/5628; G11C 11/5642; G11C 29/02; G11C 29/021; G11C 29/028; G11C 16/0483; G11C 2029/1206; G11C 5/025; G11C 16/3418; G11C 29/12; G11C 16/06; G01K 7/16; G06F 3/0658; G06F 3/0679

USPC ...................................................... 365/185.03
See application file for complete search history.

(56) References Cited

U.S. PATENT DOCUMENTS

| | | | |
|---|---|---|---|
| 5,721,455 A | 2/1998 | Takashita | |
| 7,773,446 B2 | 8/2010 | Thorp et al. | |
| 8,247,829 B2 | 8/2012 | Kim | |
| 9,016,939 B2 | 4/2015 | Chang et al. | |
| 9,599,516 B2 | 3/2017 | Lee | |
| 10,120,593 B2 | 11/2018 | Byun et al. | |
| 10,636,491 B2 * | 4/2020 | Shin .................. | G11C 7/04 |

(Continued)

FOREIGN PATENT DOCUMENTS

| | | |
|---|---|---|
| JP | 5304335 B2 | 7/2013 |
| KR | 100999760 B1 | 12/2010 |

(Continued)

*Primary Examiner* — Huan Hoang
*Assistant Examiner* — Minh Dinh
(74) *Attorney, Agent, or Firm* — Myers Bigel, P.A.

(57) ABSTRACT

A storage device including a non-volatile memory for storing data, a temperature sensor having resistance that changes according to temperature of the temperature sensor, and a temperature measurement circuit including a plurality of transistors, which are turned on or off based on a current of the temperature sensor and have different threshold voltages from one another. The temperature management circuit may be configured to apply a current to the temperature sensor and generate information indicating the temperature of the temperature sensor or indicating damage to the temperature sensor based on an output current obtained from the plurality of transistors.

20 Claims, 22 Drawing Sheets

(56) References Cited

U.S. PATENT DOCUMENTS

2015/0168226 A1* 6/2015 Hofer .................. G01K 7/01
374/170
2019/0051341 A1* 2/2019 Li .................. G11C 29/50012
2021/0005253 A1* 1/2021 Lim .................. G05F 3/262

FOREIGN PATENT DOCUMENTS

| KR | 101234990 B1 | 2/2013 |
| KR | 20130072712 A | 7/2013 |
| KR | 102317263 B1 | 10/2021 |

* cited by examiner

STORAGE DEVICES DETECTING INTERNAL TEMPERATURE AND DEFECTS BY USING TEMPERATURE SENSORS AND METHODS OF OPERATING THE SAME

CROSS-REFERENCE TO RELATED APPLICATION

This application is based on and claims priority under 35 U.S.C. § 119 to Korean Patent Application No. 10-2022-0101588, filed on Aug. 12, 2022, in the Korean Intellectual Property Office, the disclosure of which is incorporated by reference herein in its entirety.

BACKGROUND

The inventive concepts relate to storage devices, and more particularly, to storage devices configured to detect an internal temperature and/or a defect by using temperature sensors and a method of operating the same.

As a non-volatile memory, a flash memory is capable of retaining data stored therein even when power supply is interrupted. Storage devices that include a flash memory, such as solid state disks (SSD) and memory cards, are widely used, and such storage devices are useful to store or move a large amount of data.

As storage devices are widely used in various fields, there is increasing demand for technology for compensating for the temperature of the storage device. In particular, a method by which a storage device itself determines the internal temperature thereof and detects damage received from the outside are under investigation.

SUMMARY

The inventive concepts provide a storage device that itself determines the internal temperature thereof and detects damage received from the outside, and provides methods of operating the storage device.

According to some aspects of the inventive concepts, there is provided a storage device including a non-volatile memory configured to store data, a temperature sensor having a resistance that changes in correspondence to a change in temperature of the temperature sensor, and a temperature measurement circuit including a plurality of transistors, which are configured to turn on or off based on a current flow from the temperature sensor, each of the plurality of transistors having a different threshold voltage from others of the plurality of transistors, wherein the temperature measurement circuit is configured to generate information indicating the temperature and/or indicating damage to the temperature sensor based on an output current obtained from the plurality of transistors.

According to some aspects of the inventive concepts, there is provided a method of operating a storage device including a controller and a non-volatile memory, the method including requesting, by the controller, temperature information from a temperature measurement circuit, measuring, by the temperature measurement circuit, a resistance of a temperature sensor having a resistance that changes according to a temperature of the temperature sensor, resulting in a measured resistance value, generating, by the temperature measurement circuit and based on the measured resistance value, temperature information indicating the temperature of the temperature sensor and/or damage information indicating damage to the temperature sensor, the generating comprising using a plurality of transistors having different threshold voltages from one another; and transmitting, by the temperature measurement circuit, the generated temperature information and/or the generated damage information to the non-volatile memory or the controller.

According to some aspects of the inventive concepts, there is provided a solid state disk (SSD) including a semiconductor package including a non-volatile memory configured to store data and a temperature sensor having a resistance that changes according to a temperature of the temperature sensor; and a SSD controller, wherein the SSD controller is configured to control the semiconductor package and includes a temperature measurement circuit, wherein the temperature measurement circuit includes a plurality of transistors, which are configured to turn on or off based on a current flow of the temperature sensor, the plurality of transistors having different threshold voltages from one another, and wherein the temperature measurement circuit is configured to apply a current to the temperature sensor and to information indicating the temperature or indicating damage to the temperature sensor based on an output current obtained from the plurality of transistors.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
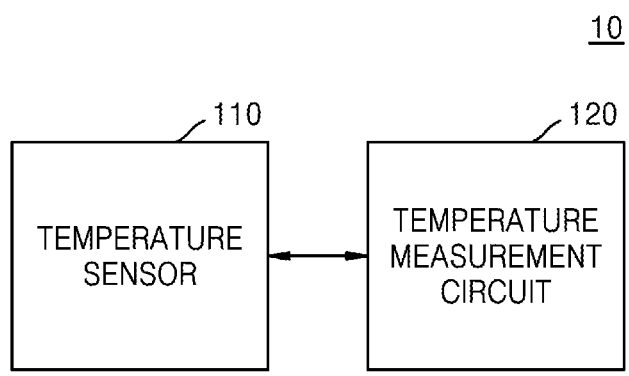
FIG. 1 is a diagram showing a temperature detector according to some embodiments.

FIG. 1 is a diagram showing a temperature detector according to some embodiments.

Referring to FIG. 1, a temperature detector 10 may include a temperature sensor 110 and a temperature measurement circuit 120. The temperature sensor 110 may include a material having a resistance that changes according to temperature. A material having a resistance that changes according to temperature may be referred to as a resistance temperature detector (RTD).

The temperature measurement circuit 120 may measure the temperature of a device including the temperature sensor 110 by using the temperature sensor 110. For example, the temperature measurement circuit 120 may measure the temperature of a device including the temperature sensor 110 by measuring the resistance of the temperature sensor 110. The temperature measurement circuit 120 may express a measured temperature in bits. Also, when a measured resistance value exceeds a threshold value, the temperature measurement circuit 120 may determine that there is a defect in the device including the temperature sensor 110. The temperature measurement circuit 120 may express a defect of the device including the temperature sensor 110 in bits.

The temperature sensor 110 may be included in a non-volatile memory package. Non-volatile memory packages may include a non-volatile memory, such as a NAND flash memory, a vertical NAND flash memory, a NOR flash memory, a resistive random access memory, a phase-change memory, and/or a magnetoresistive random access memory. The temperature measurement circuit 120 may be included in the same package as the temperature sensor 110. However, examples of embodiments are not limited thereto, and the temperature measurement circuit 120 may be outside a package including the temperature sensor 110. The temperature measurement circuit 120 and the temperature sensor 110 may be electrically connected to each other through a substrate.

Figure 2A:
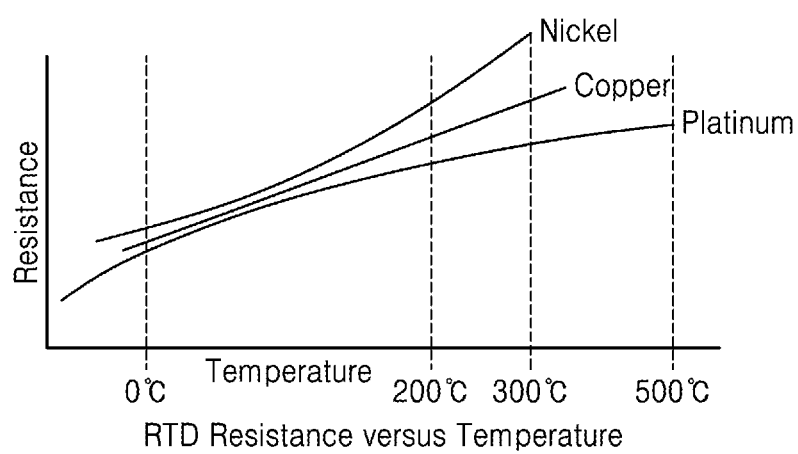
FIGS. 2A and 2B are diagrams showing a relationship between temperature and resistance of a temperature sensor according to some embodiments.
Figure 2B:
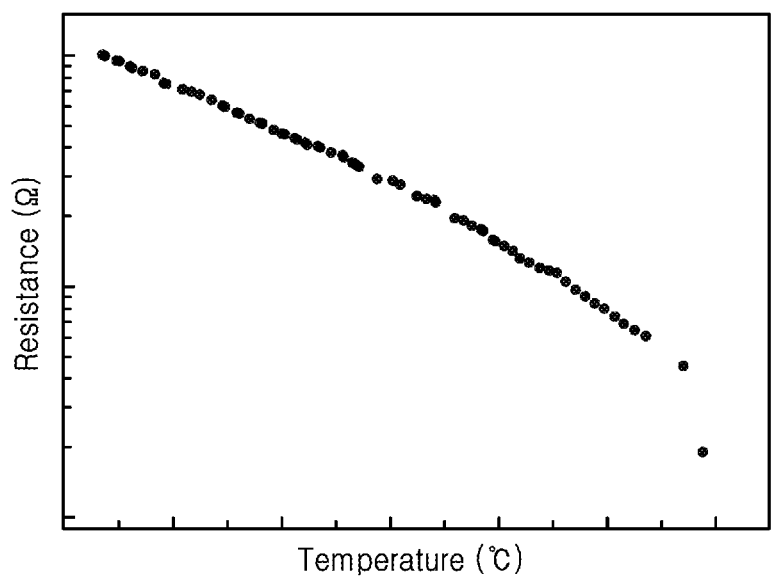

FIGS. 2A and 2B are diagrams showing a relationship between temperature and resistance of a temperature sensor according to some embodiments. FIGS. 2A and 2B may be described with reference to FIG. 1.

Referring to FIG. 2A, the temperature sensor 110 may include a material having resistance that changes according to temperature. Stated differently, the temperature sensor 110 may have a material having a resistance that changes in correspondence to a change in a temperature of the material, and thus the temperature sensor 110 may have a resistance that changes in correspondence to a change in a temperature of the temperature sensor 110. In greater detail, the temperature sensor 110 may include a material having a resistance that increases as the temperature increases. For example, the temperature sensor 110 may include at least one of nickel, copper, and platinum.

Referring to FIG. 2B, the temperature sensor 110 may include a material having resistance that decreases as the temperature increases.

Figure 3A:
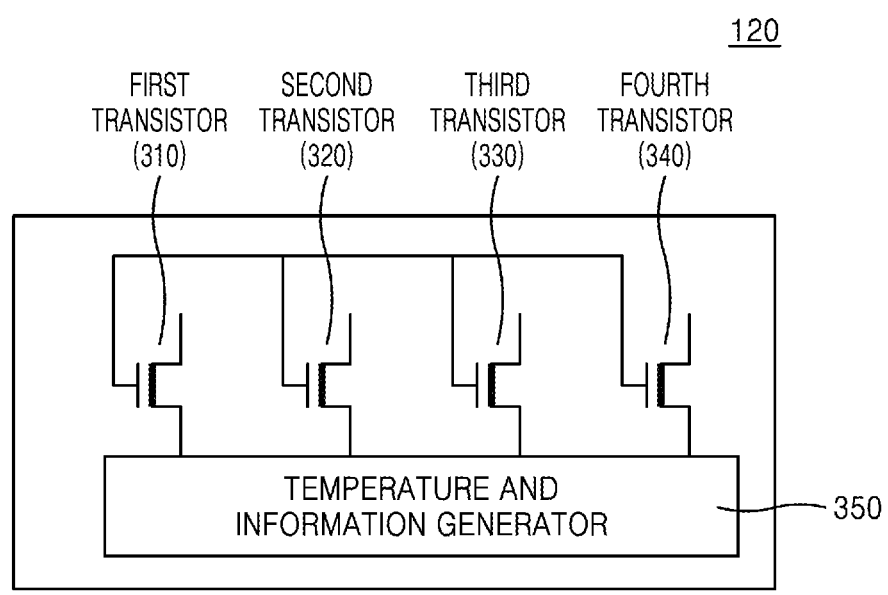
FIG. 3A is a diagram showing a temperature measurement circuit according to some embodiments.

FIG. 3A is a diagram showing a temperature measurement circuit according to some embodiments. FIG. 3A may be described with reference to FIG. 1.

Referring to FIG. 3A, the temperature measurement circuit 120 may include first to fourth transistors 310, 320, 330, and 340 and a temperature and damage information generator 350. The first to fourth transistors 310, 320, 330, and 340 may have different threshold voltages from one another. The temperature measurement circuit 120 may measure a temperature by measuring the resistance of the temperature sensor 110. In greater detail, the temperature measurement circuit 120 may generate temperature information and damage information regarding the temperature sensor 110 by using the resistance value of the temperature sensor 110 having resistance that changes according to temperature, and by using the first to fourth transistors 310, 320, 330, and 340 having different threshold voltages from one another.

For example, as a current is applied to the temperature sensor 110 (e.g., as a current flows through the temperature sensor 110), an output voltage of the temperature sensor 110 may be applied to the first to fourth transistors 310, 320, 330, and 340 of the temperature measurement circuit 120. Since the resistance of the temperature sensor 110 may change according to temperature, the value of the output voltage of the temperature sensor 110 may change according to the temperature. Therefore, as the temperature changes, voltages applied to the first to fourth transistors 310, 320, 330, and 340 of the temperature measurement circuit 120 may change.

As stated above, the first transistor 310, the second transistor 320, the third transistor 330, and the fourth transistor 340 may have threshold voltages different from one another. For example, the second transistor 320 may have a higher threshold voltage than the first transistor 310, the third transistor 330 may have a higher threshold voltage than the second transistor 320, and the fourth transistor 340 may have a higher threshold voltage than the third transistor 330. Therefore, even when the same voltage is applied to the first transistor 310, the second transistor 320, the third transistor 330, and the fourth transistor 340, some transistors may be turned on and the remaining transistors may be turned off. Therefore, the temperature and damage information generator 350 may generate different temperature information for different hardware components, respectively. The first to fourth transistors 310, 320, 330, and 340 may be connected to a driving voltage source (not shown).

The temperature measurement circuit 120 may express information regarding temperature and damage in bits by using the first to fourth transistors 310, 320, 330, and 340.

Any one of the first to fourth transistors 310, 320, 330, and 340 may be a transistor for damage information. For example, the first transistor 310, the second transistor 320, and the third transistor 330 may be associated with bits regarding or indicating the temperature of the temperature sensor 110, and the fourth transistor 340 may be associated with a bit regarding or indicating damage of the temperature sensor 110. The first transistor 310 may be associated with a bit regarding or indicating a first temperature. The second transistor 320 may be associated with a bit regarding or indicating a second temperature. The third transistor 330 may be associated with a bit regarding or indicating a third temperature. The fourth transistor 340 may be associated with a bit regarding or indicating damage.

When the temperature sensor 110 is damaged, the temperature sensor 110 may be opened or short-circuited. The fourth transistor 340 associated with damage information may have a higher threshold voltage than the first transistor 310, the second transistor 320, and the third transistor 330. According to some embodiments, the fourth transistor 340 associated with damage information may have a lower threshold voltage than the first transistor 310, the second transistor 320, and the third transistor 330 associated with temperature information.

The temperature and damage information generator 350 may generate information regarding temperature or information regarding damage by checking states of the first to fourth transistors 310, 320, 330, and 340. For example, the temperature and damage information generator 350 may generate information indicating a temperature or information indicating damage of the temperature sensor 110 based on calculations of bits of turned-on transistors from among the first to fourth transistors 310, 320, 330, and 340.

The temperature measurement circuit 120 may include various numbers of transistors, and the present disclosure and embodiments of the inventive concepts thereof are not limited to the temperature measurement circuit 120 including four transistors.

Figure 3B:
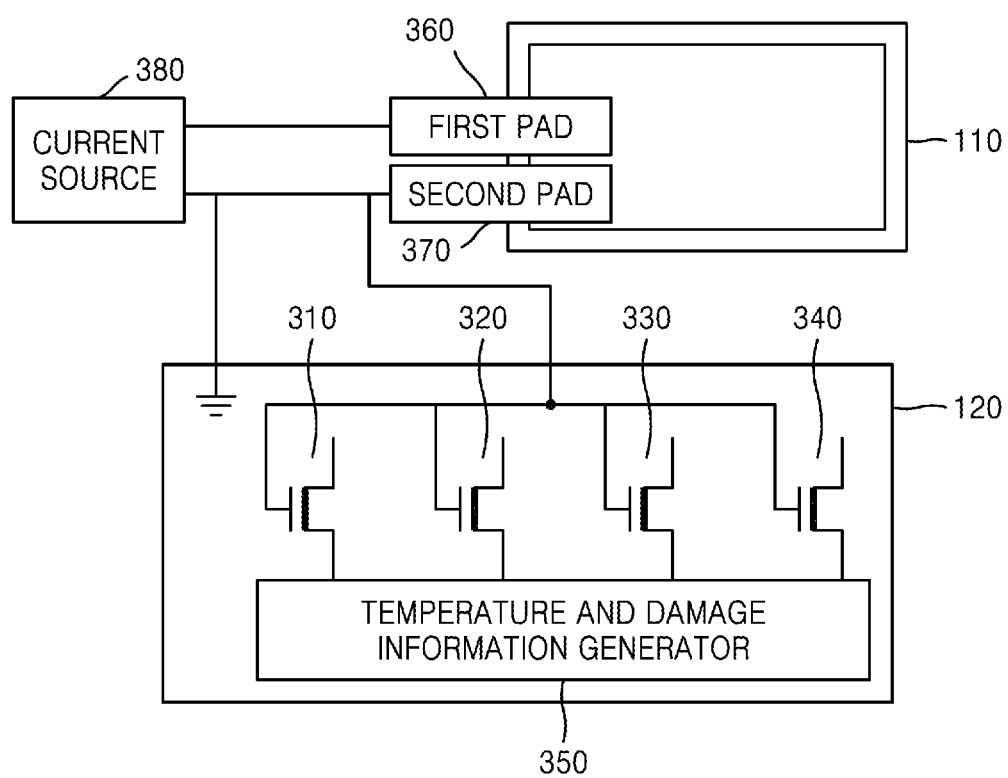
FIG. 3B is a diagram showing a temperature detector according to some embodiments.

FIG. 3B is a diagram showing a temperature detector according to some embodiments.

Referring to FIG. 3B, the temperature sensor 110 may receive a current from a current source 380. For example, the temperature sensor 110 may receive a current from the current source 380 through a first pad 360, and the current may flow through the temperature sensor 110. An output current may be output from the temperature sensor 110 to the temperature measurement circuit 120 through a second pad 370. The current source 380 may be located outside a non-volatile memory package 40 (see FIG. 4A). For example, the temperature sensor 110 may receive a current from the current source 380 located outside the non-volatile memory package 40. Also, the temperature sensor 110 may receive a current from the current source 380 located outside the non-volatile memory package 40 through a controller 410 (FIG. 4A) located in the non-volatile memory package 40.

According to some embodiments, the temperature sensor 110 may receive a current from a power management integrated circuit (PMIC). The PMIC may be located outside the non-volatile memory package 40.

According to some embodiments, the temperature sensor 110 may receive a voltage from a voltage source, but example embodiments are not limited thereto. In greater detail, the temperature sensor 110 may receive a voltage through the first pad 360 and the second pad 370.

Figure 4A:
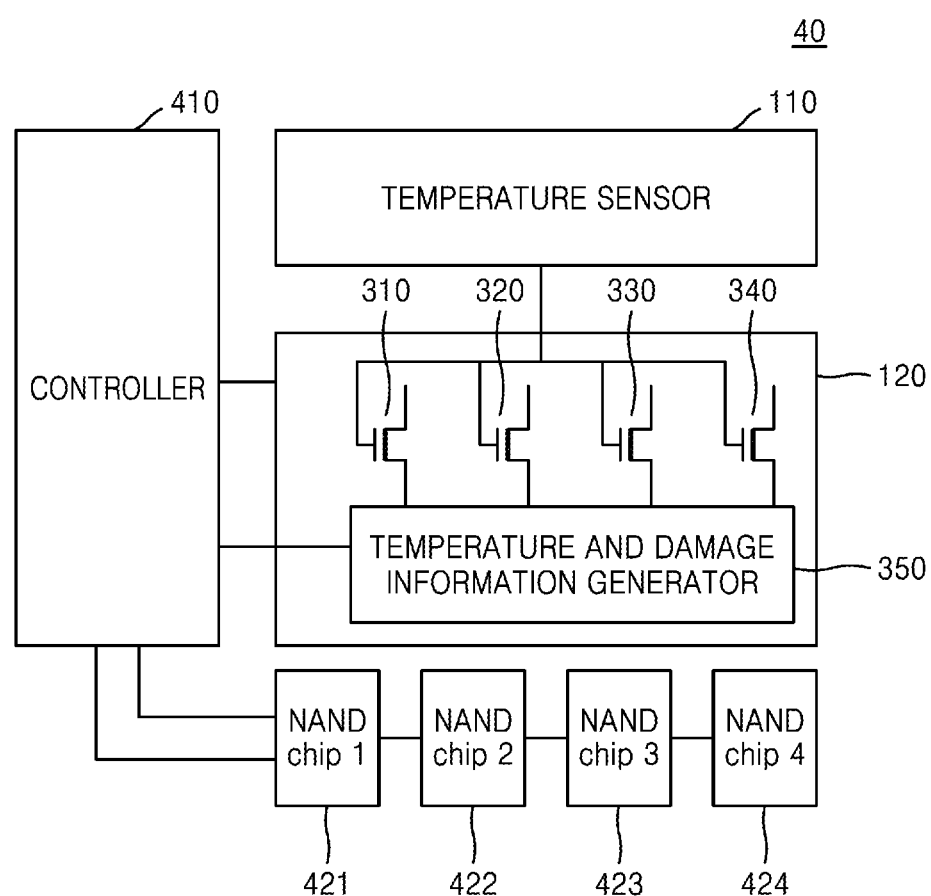
FIGS. 4A and 4B are diagrams showing a non-volatile memory package according to some embodiments.
Figure 4B:
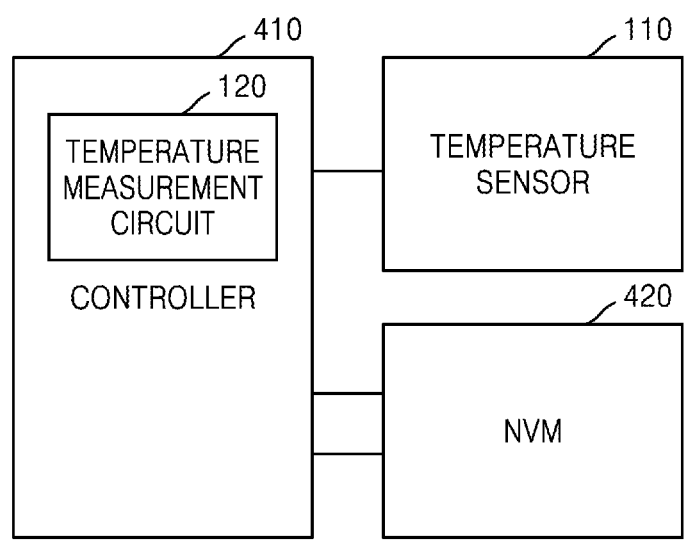

FIGS. 4A and 4B are diagrams showing a non-volatile memory package according to some embodiments.

Referring to FIG. 4A, the non-volatile memory package 40 may include the controller 410, the temperature sensor 110, the temperature measurement circuit 120, a first NAND chip 421, a second NAND chip 422, a third NAND chip 423, and a fourth NAND chip 424. The temperature measurement circuit 120 may include the first transistor 310, the second transistor 320, the third transistor 330, the fourth transistor 340, and the temperature and damage information generator 350. The temperature measurement circuit 120 may be deposited on a first substrate 510 to be described later with reference to FIGS. 5A and 5B.

The temperature measurement circuit 120 may generate temperature information and damage information regarding the temperature sensor 110 by using the resistance value of the temperature sensor 110 having a resistance that changes according to temperature and the first to fourth transistors 310, 320, 330, and 340 having different threshold voltages from one another. In other words, the temperature measurement circuit 120 may measure the temperature of the non-volatile memory package 40 and detect damage to the non-volatile memory package 40 including the temperature sensor 110.

Referring to FIG. 4B, the non-volatile memory package 40 may include the temperature measurement circuit 120, the controller 410, the temperature sensor 110, and a non-volatile memory (NVM) 420. The temperature measurement circuit 120 may be located inside the controller 410 of the non-volatile memory package 40.

According to some embodiments, the first to fourth transistors 310, 320, 330, and 340 may each be an N-type transistor. The first to fourth transistors 310, 320, 330, and 340 may have first to fourth threshold voltages, respectively. The level of the first threshold voltage may be lower than the level of the second threshold voltage, and the level of the second threshold voltage may be lower than the level of the third threshold voltage. An output voltage of the temperature sensor 110 may be applied to gates of the first to fourth transistors 310, 320, 330, and 340.

According to some embodiments, when the resistance of the temperature sensor 110 is proportional to the temperature, as the temperature increases, the output voltage of the temperature sensor 110 applied to the first to fourth transistors 310, 320, 330, and 340 may decrease. Therefore, as the temperature increases, the third transistor 330, the second transistor 320, and the first transistor 310 may be sequentially turned off, and first to third bits according to output currents of the first transistor 310, the second transistor 320, and the third transistor 330 may represent different temperatures, respectively. In other words, the first temperature indicated by a first bit may be higher than the second temperature indicated by a second bit, and the second temperature indicated by the second bit may be higher than the third temperature indicated by a third bit. Furthermore, it may be determined whether the temperature sensor 110 is damaged based on the bit by the output current of the fourth transistor 340. For example, when the level of a fourth threshold voltage of the fourth transistor 340 is higher than the level of a third threshold voltage, the fourth transistor 340 may be turned on when the output voltage of the temperature sensor 110 is at a level indicating the short-circuit of the temperature sensor 110. Therefore, a fourth bit by the fourth transistor 340 may indicate whether the temperature sensor 110 is short-circuited. For example, when the level of a fourth threshold voltage of the fourth transistor 340 is higher than the level of the first threshold voltage, the fourth transistor 340 may be turned on when the output voltage of the temperature sensor 110 is at a level indicating the opening of the temperature sensor 110. Therefore, the fourth bit by the fourth transistor 340 may indicate whether the temperature sensor 110 is opened.

According to some embodiments, when the resistance of the temperature sensor 110 is inversely proportional to the temperature, as the temperature increases, the output voltage of the temperature sensor 110 applied to the first to fourth transistors 310, 320, 330, and 340 may increase. As described above, based on output currents of the first transistor 310, the second transistor 320, and the third transistor 330, bits respectively representing different temperatures may be generated, and, based on the output current of the fourth transistor 340, a bit indicating opening or a short-circuit may be generated.

Figure 4C:
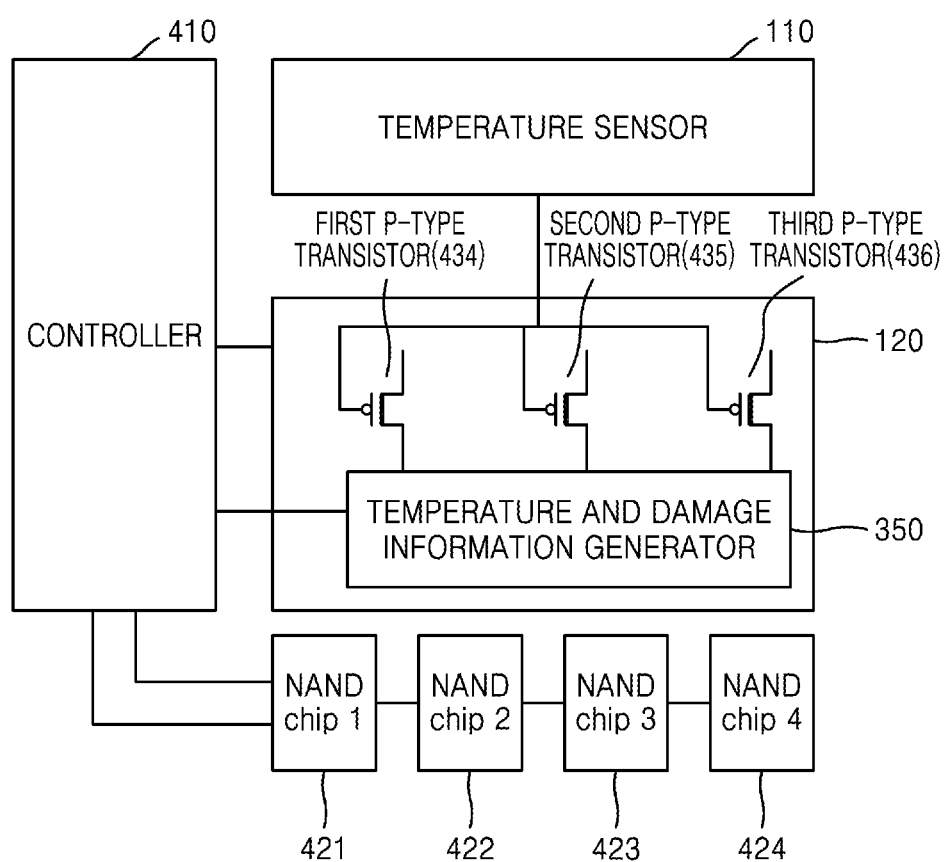
FIG. 4C is a diagram showing a non-volatile memory package according to some embodiments.

FIG. 4C is a diagram showing a non-volatile memory package according to some embodiments.

Referring to FIG. 4C, the non-volatile memory package 40 may include the controller 410, the temperature sensor 110, the temperature measurement circuit 120, the first NAND chip 421, the second NAND chip 422, the third NAND chip 423, and the fourth NAND chip 424. The temperature measurement circuit 120 may include a first P-type transistor 434, a second P-type transistor 435, a third P-type transistor 436, and the temperature and damage information generator 350.

The temperature measurement circuit 120 may generate temperature information and damage information regarding the temperature sensor 110 by using the resistance value of the temperature sensor 110 having a resistance that changes according to temperature and a plurality of transistors, that is, the first P-type transistor 434, the second P-type transistor 435, and the third P-type transistor 436, having different threshold voltages from one another.

For example, when the resistance of the temperature sensor 110 is inversely proportional to the temperature, the temperature measurement circuit 120 may include the first P-type transistor 434 having a first threshold voltage and the second P-type transistor 435 having a second threshold voltage having a level higher than that of the first threshold voltage. The temperature measurement circuit 120 may generate the temperature information including a first temperature based on an output voltage of the first P-type transistor 434. The temperature measurement circuit 120 may generate the temperature information including a second temperature that is higher than the first temperature based on an output voltage of the second P-type transistor 435. The temperature information may include bit information regarding the first temperature and bit information regarding the second temperature. The temperature measurement circuit 120 may include the third P-type transistor 436 having a threshold voltage higher than the second threshold voltage. The temperature measurement circuit 120 may generate damage information indicating damage to a temperature sensor based on an output voltage of the third P-type transistor 436. The damage information may include bit information regarding damage.

The resistance of the temperature sensor 110 may be proportional or inverse proportional to the temperature, and the transistors of the temperature measurement circuit 120 may be either N-type or P-type. Also, the type of the temperature sensor 110 and the type of the transistors of the temperature measurement circuit 120 are not limited to those in the embodiment described above, and various embodiments may be implemented according to combinations thereof.

Figure 5A:
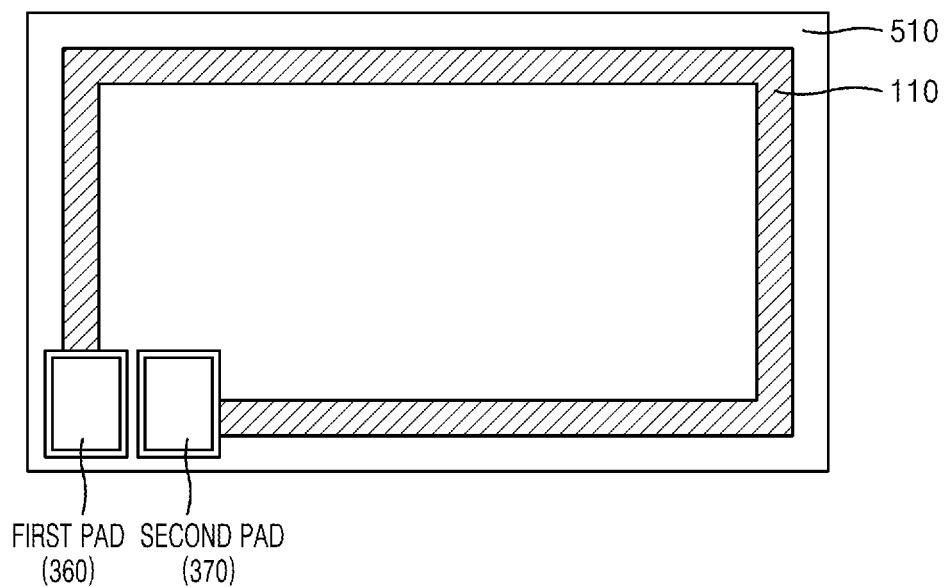
FIGS. 5A and 5B are diagrams showing a substrate according to some embodiments.
Figure 5B:
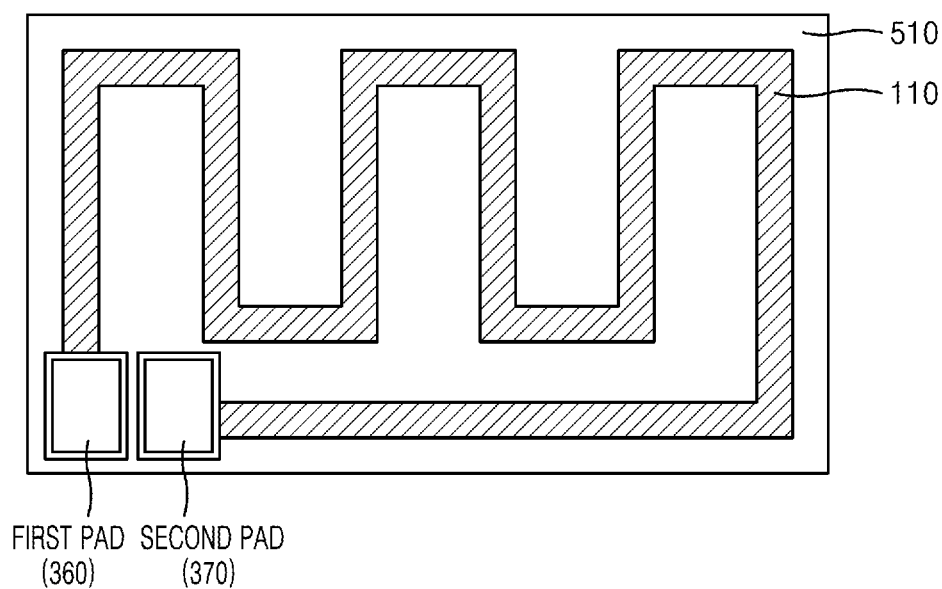

FIGS. 5A and 5B are diagrams showing a substrate according to some embodiments.

Referring to FIG. 5A, the temperature sensor 110 may be deposited on the first substrate 510. The temperature sensor 110 may be deposited along edges of the first substrate 510. In greater detail, the temperature sensor 110 may be deposited on the first substrate 510 together with the first pad 360 and the second pad 370.

Referring to FIG. 5B, the first substrate 510 may be referred to as a thin film. The temperature sensor 110 may be deposited on the first substrate 510. The temperature sensor 110 may be deposited not only on edges of the first substrate 510, but also on the center portion of the first substrate 510. Since the temperature sensor 110 is also deposited on the center portion of the first substrate 510 as well as the edges of the first substrate 510, the temperature sensor 110 may detect damage to a wide area of the first substrate 510. The first substrate 510 may be inserted into a non-volatile memory package. Therefore, the temperature sensor 110 may detect the temperature or damage of the non-volatile memory package.

Figure 5C:
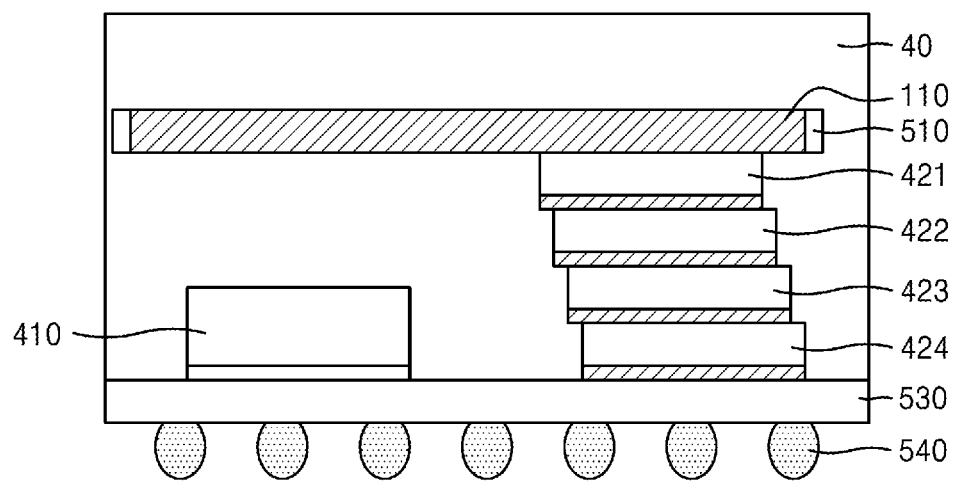
FIGS. 5C and 5D are diagrams showing a non-volatile memory package according to some embodiments.
Figure 5D:
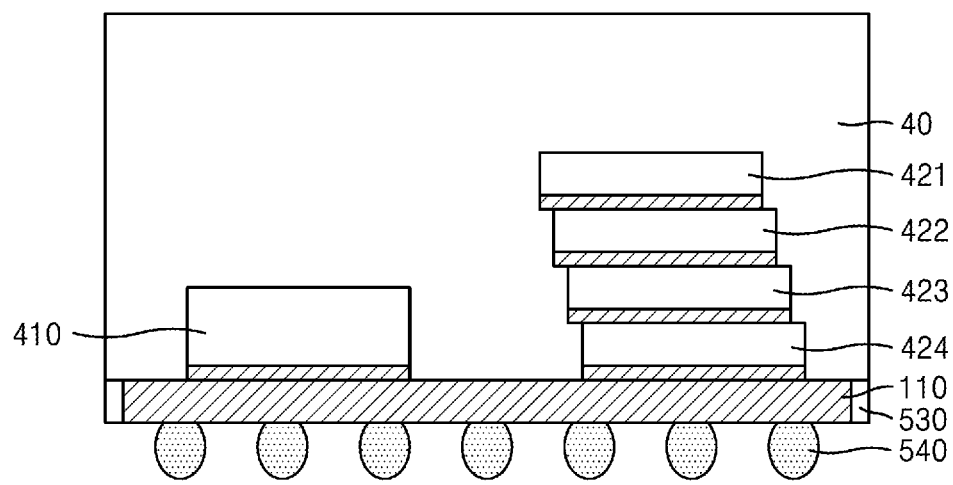

FIGS. 5C and 5D are diagrams showing a non-volatile memory package according to some embodiments.

Referring to FIG. 5C, the non-volatile memory package 40 may include the first substrate 510, the controller 410, the first NAND chip 421, the second NAND chip 422, the third NAND chip 423, the fourth NAND chip 424, a PCB substrate 530, and a plurality of balls 540. The first to fourth NAND chips 421 to 424 may be sequentially stacked on the PCB substrate 530 (e.g., in a vertical direction perpendicular to a major surface of the first substrate 510 and/or a major surface of the PCB substrate 530), and the first substrate 510 may be formed on the first NAND chip 421. The controller 410 and the first to fourth NAND chips 421 to 424 may be connected to each other through wires in the PCB substrate 530 and may transmit signals to the outside of the non-volatile memory package 40 or receive signals from the outside of the non-volatile memory package 40 through the plurality of balls 540. The first substrate 510 may be inserted into the non-volatile memory package 40 as shown in FIG. 5C. As described above, the temperature sensor 110 may be deposited on the first substrate 510.

Referring to FIG. 5D, and in contrast FIG. 5C, the temperature sensor 110 may be deposited on the PCB substrate 530 rather than on the first substrate 510.

The temperature sensor 110 may be formed by using any one method from among physical vapor deposition (PVD), chemical vapor deposition (CVD), and atomic layer deposition (ALD).

The PVD is a technique for depositing a metal to be deposited on a substrate by vaporizing the metal in a vacuum. The PVD may include thermal evaporation, e-beam evaporation, and sputtering. The CVD is a technique for depositing a material onto a substrate through a chemical reaction. The ALD is a technique for growing a thin film by alternately injecting reactive raw materials into wafer surface.

Figure 5E:
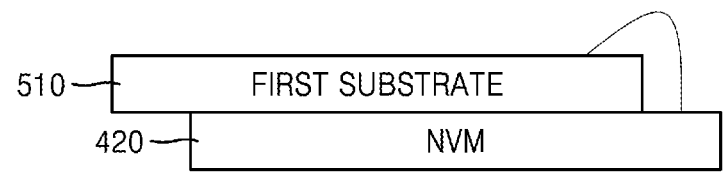
FIGS. 5E, 5F, and 5G are diagrams showing a stack structure of a first substrate according to some embodiments.
Figure 5F:
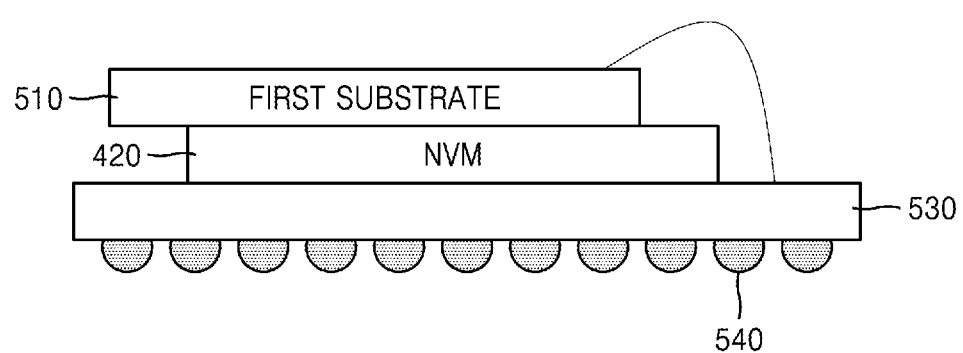
Figure 5G:
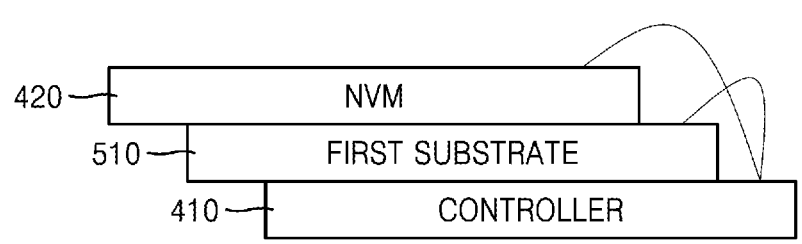

FIGS. 5E, 5F, and 5G are diagrams showing a stack structure of a first substrate according to some embodiments.

Referring to FIG. 5E, the first substrate 510 may be positioned on the NVM 420. Therefore, the first substrate 510 and the NVM 420 may constitute a stack structure. The first substrate 510 and the NVM 420 may be connected to each other through a copper wire or the like. The NVM 420 may correspond to a NAND chip (e.g., 421 of FIG. 5C). Although FIG. 5E shows only one NVM 420, the number of NVMs 420 is not limited thereto.

As described above, a temperature sensor (110 of FIG. 1) may be deposited on the first substrate 510. According to some embodiments, a controller (e.g., 410 of FIG. 5C) may be provided outside a non-volatile memory package, and the temperature measurement circuit 120 (FIG. 1) may be included in the controller outside the non-volatile memory package. For example, in the case of a solid state disk (SSD), an SSD controller provided outside the non-volatile memory package 40 may include the temperature measurement circuit 120.

According to some embodiments, the temperature measurement circuit 120 (FIG. 1) may be included in the first substrate 510.

Referring to FIG. 5F, the first substrate 510 may be connected to at least one of the plurality of balls 540 of the PCB substrate 530. The first substrate 510 may be connected to a controller outside the non-volatile memory package 40 through the at least one or more of the plurality of balls 540. For example, in the case of an SSD, the first substrate 510 may be connected to an SSD controller outside a non-volatile memory package through at least one or more of the plurality of balls 540.

Referring to FIG. 5G, a stacked structure in which the first substrate 510 is positioned between the NVM 420 and the controller 410 in the non-volatile memory package may be formed. For example, the first substrate 510 may be positioned on the controller 410, and the NVM 420 may be positioned on the first substrate 510. In this case, the NVM 420 and the controller 410 may be connected to each other, and the first substrate 510 and the controller 410 may be connected to each other.

Figure 6A:
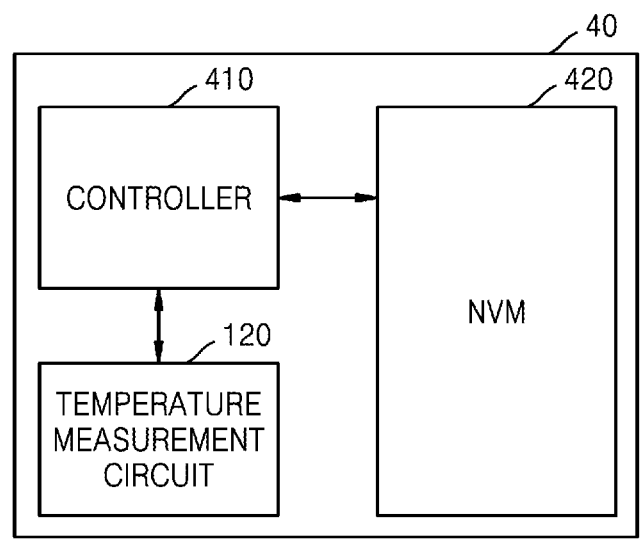
FIGS. 6A and 6B are diagrams showing a non-volatile memory package according to some embodiments.
Figure 6B:
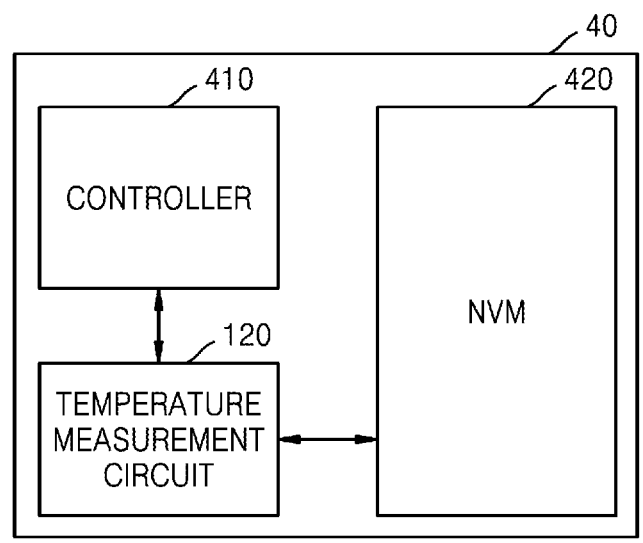

FIGS. 6A and 6B are diagrams showing a semiconductor package according to an embodiment.

Referring to FIG. 6A, the non-volatile memory package 40 may include the controller 410, the temperature measurement circuit 120, and the NVM 420. The controller 410 may communicate with the temperature measurement circuit 120 and the NVM 420. The controller 410 may receive temperature information or damage information from the temperature measurement circuit 120. Also, the controller 410 may transmit any one command from among erase, read, and program commands to the NVM 420. Also, the controller 410 may transmit temperature information or damage information to the NVM 420. The NVM 420 may adjust an erase voltage, a read voltage, and/or a program voltage by using temperature information. Also, the controller 410 may transmit a trim parameter based on temperature information or damage information to the NVM 420. The NVM 420 may perform any one received command from among erase, read, and program commands based on the received trim parameter. Therefore, since an erase operation, a read operation, or a program operation optimized for the temperature is performed, the speed of an erase operation, a read operation, or a program operation may be increased.

Referring to FIG. 6B, the non-volatile memory package 40 may include the controller 410, the temperature measurement circuit 120, and the NVM 420. The temperature measurement circuit 120 may communicate directly with the NVM 420 as well as the controller 410 inside the non-volatile memory package 40. Even in this case, the controller 410 may transmit any one commands from among erase, read, and program commands to the NVM 420. The temperature measurement circuit 120 may directly transmit a trim parameter to the NVM 420. The NVM 420 may perform any one command from among erase, read, and program commands received from the controller 410 based on the trim parameter received from the temperature measurement circuit 120.

Figure 7:
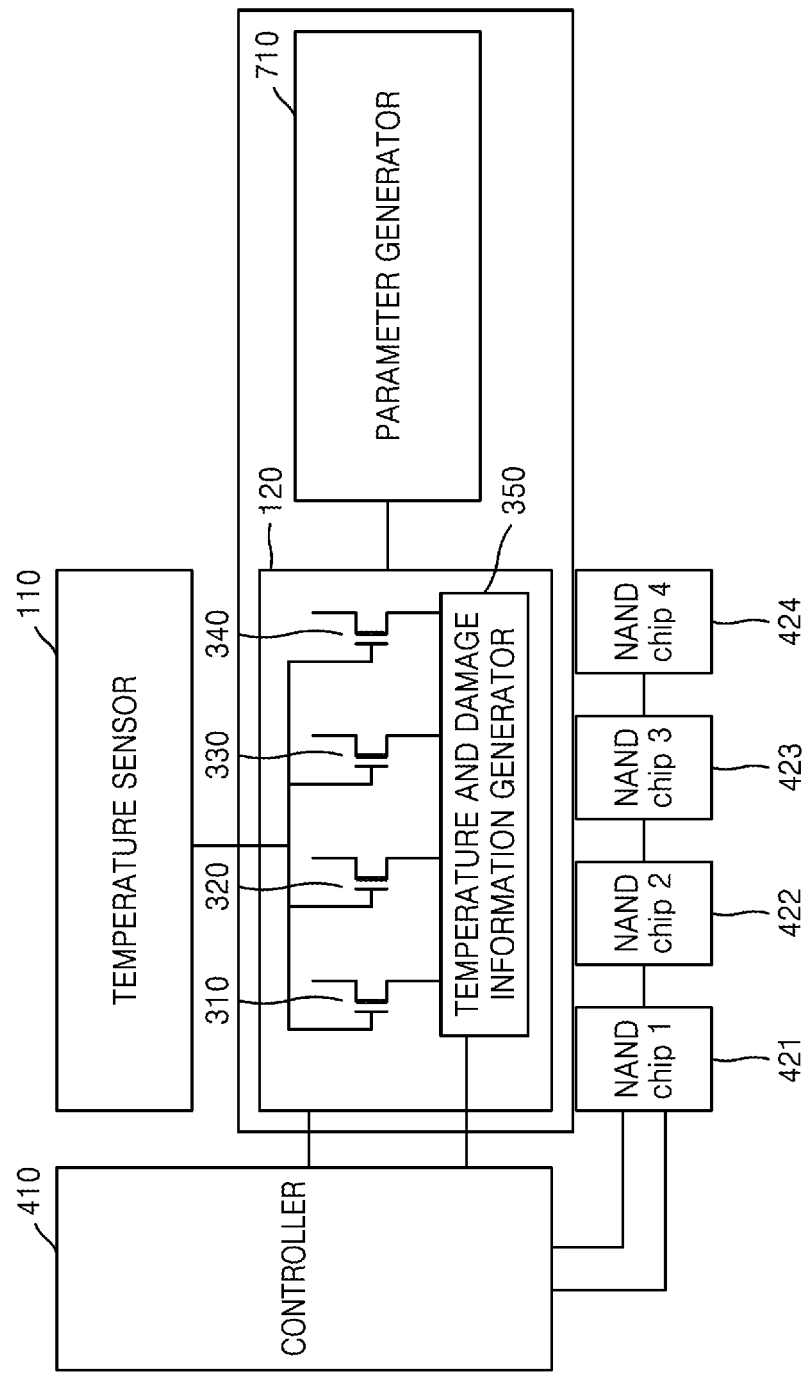
FIG. 7 is a diagram showing a non-volatile memory package according to some embodiments.

FIG. 7 is a diagrams showing a semiconductor package according to some embodiments.

Referring to FIG. 7, the non-volatile memory package 40 (FIG. 4) may include the controller 410, the temperature sensor 110, the temperature measurement circuit 120, a parameter generator 710, the first NAND chip 421, the second NAND chip 422, the third NAND chip 423, and the fourth NAND chip 424. The temperature measurement circuit 120 may include the first transistor 310, the second transistor 320, the third transistor 330, the fourth transistor 340, and the temperature and damage information generator 350.

The parameter generator 710 may generate a trim parameter for adjusting characteristics of at least one of the first NAND chip 421, the second NAND chip 422, the third NAND chip 423, and the fourth NAND chip 424 based on temperature information generated by the temperature measurement circuit 120. The parameter generator 710 may generate a trim parameter related to at least one of erase, program, and/or read operations for a non-volatile memory based on the temperature information generated by the temperature measurement circuit 120. For example, the parameter generator 710 may generate at least one of a trim parameter for adjusting an erase voltage of the first NAND chip 421, a trim parameter for adjusting a program voltage of the first NAND chip 421, and/or a trim parameter for adjusting a read voltage of the first NAND chip 421 based on temperature information generated by the temperature measurement circuit 120.

The first NAND chip 421, the second NAND chip 422, the third NAND chip 423, and the fourth NAND chip 424 may receive trim parameters from the controller 410 or the temperature measurement circuit 120 and perform any one of erase, read, and program operations based on received trim parameters.

The non-volatile memory package 40 may include various numbers of NAND chips, and the number of NAND chips is not limited to the example embodiment described above.

Figure 8A:
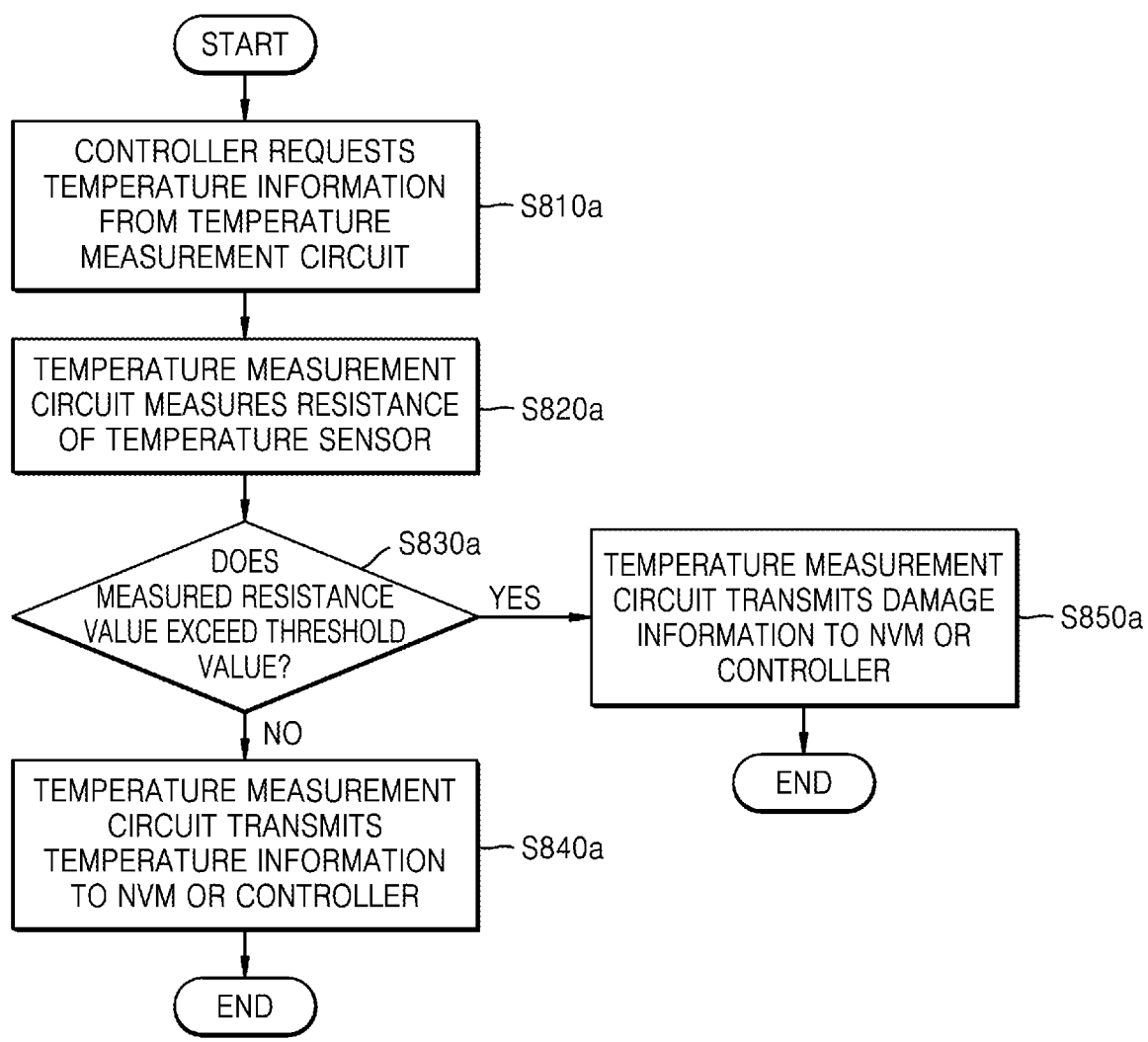
FIG. 8A is a diagram showing an operation process of a non-volatile memory package according to some embodiments.

FIG. 8A is a diagram showing an operation process of a non-volatile memory package according to some embodiments.

Referring to FIG. 8A, in operation S810a, the controller 410 (FIG. 4A) may request temperature information from the temperature measurement circuit 120 (FIG. 1).

In operation S820a, the temperature measurement circuit 120 may measure the resistance of the temperature sensor 110 (FIG. 1). For example, the temperature measurement circuit 120 may control a current source to supply a current to the temperature sensor 110 and measure the resistance of the temperature sensor 110 by using an output voltage of the temperature sensor 110. In another example, the temperature measurement circuit 120 may control a voltage source to supply a voltage to the temperature sensor 110 and measure the resistance of the temperature sensor 110 by using an output current of the temperature sensor 110.

The temperature measurement circuit 120 may generate temperature information and generate damage information regarding the temperature sensor 110 by using transistors having threshold voltages different from one another and a measured resistance value of the temperature sensor 110.

In operation S830a, the temperature measurement circuit 120 may determine whether the measured resistance value exceeds a threshold value. When the temperature sensor 110 is damaged, the temperature sensor 110 may have a very high resistance value. Therefore, when the resistance value of the temperature sensor 110 measured by the temperature measurement circuit 120 exceeds the threshold value (YES branch from operation S830a), damage information may be generated by performing a bit calculation of the temperature sensor 110. The threshold value may be a pre-set or predetermined value. When the resistance value of the temperature sensor 110 measured by the temperature measurement circuit 120 does not exceed the threshold value (NO branch from operation S830a), temperature information may be generated by performing a bit calculation of the temperature sensor 110.

In operation S840a, when the measured resistance value does not exceed the threshold value, the temperature measurement circuit 120 may transmit temperature information to the NVM 420 (FIG. 4) or the controller 410.

In operation S850a, when the measured resistance value exceeds the threshold value, the temperature measurement circuit 120 may transmit damage information to the NVM 420 or the controller 410.

Embodiments are not limited to the case stated above in which the resistance of the temperature sensor 110 becomes very high due to damage (e.g., when the temperature sensor 110 is opened). In some embodiments, the inventive concepts of the present disclosure may be implemented with a combination of the temperature sensor 110 and the temperature measurement circuit 120 in a case in which the resistance of the temperature sensor 110 becomes very low (e.g., when the temperature sensor 110 is short-circuited).

Figure 8B:
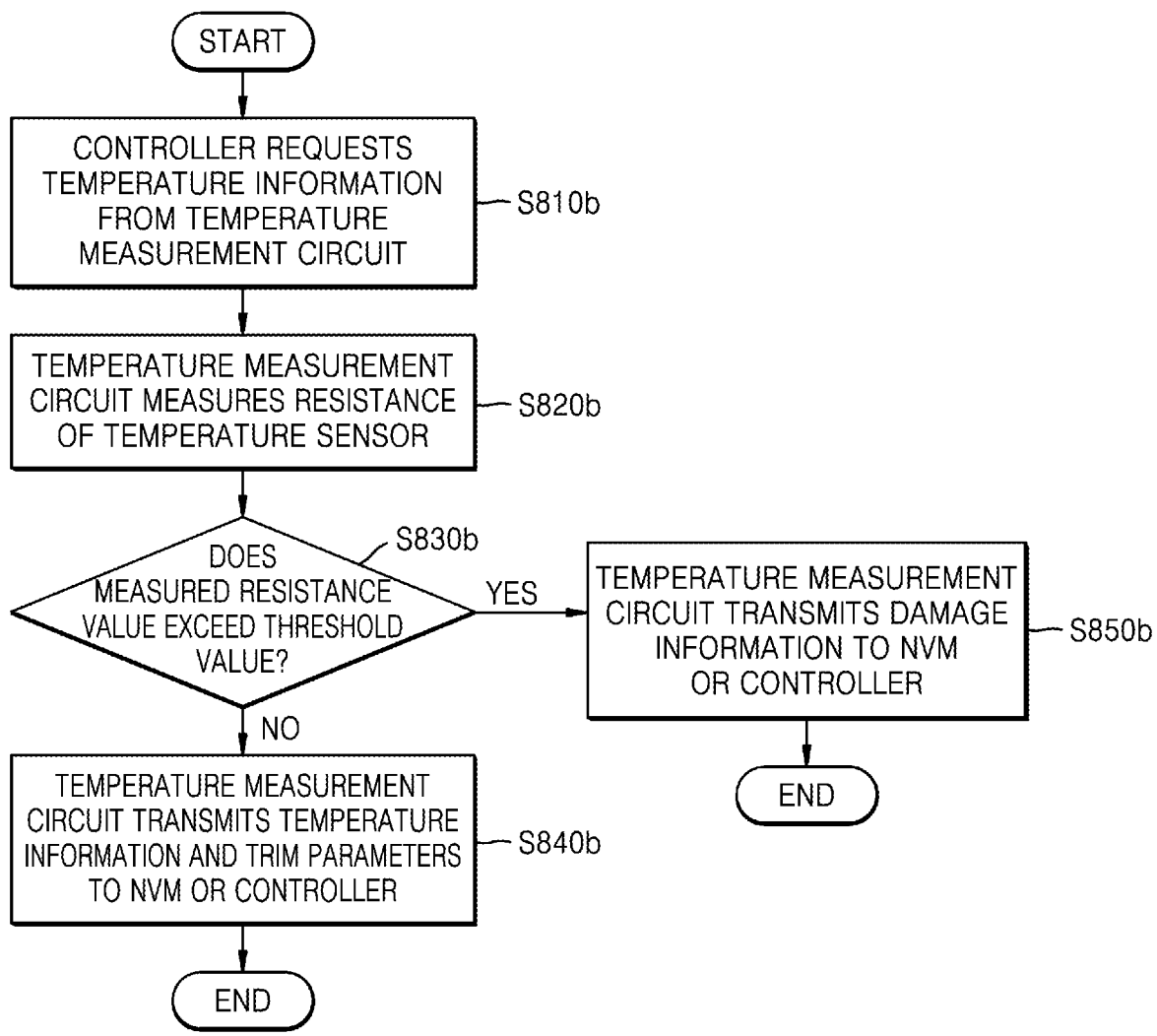
FIG. 8B is a diagram showing an operation process of a non-volatile memory package according to some embodiments.

FIG. 8B is a diagram showing an operation process of a non-volatile memory package according to some embodiments. The non-volatile memory package 40 (FIG. 4A) according to the example shown in FIG. 8B may include the NVM 420 (FIG. 4B), the temperature sensor 110 (FIG. 1), the temperature measurement circuit 120 (FIG. 1), and the controller 410 (FIG. 4A), wherein the temperature measurement circuit 120 may include the parameter generator 710 (FIG. 7).

Referring to FIG. 8A, in operation S810b, the controller 410 may request temperature information from the temperature measurement circuit 120.

In operation S820b, the temperature measurement circuit 120 may measure the resistance of the temperature sensor 110.

In operation S830b, the temperature measurement circuit 120 may determine whether the measured resistance value exceeds a threshold value.

In operation S840b, when the measured resistance value does not exceed the threshold value (NO branch from operation S830b), the temperature measurement circuit 120 may transmit temperature information and trim parameters to the NVM 420 (FIG. 4) or the controller 410.

In operation S850b, when the measured resistance value exceeds the threshold value (YES branch from operation S830b), the temperature measurement circuit 120 may transmit damage information to the NVM 420 or the controller 410.

Embodiments are not limited to the case stated above in which the resistance of the temperature sensor 110 becomes high or very high due to damage (e.g., when the temperature sensor 110 is opened). For example, the inventive concepts of the present disclosure may be implemented with a combination of the temperature sensor 110 and the temperature measurement circuit 120 in a case in which the resistance of the temperature sensor 110 becomes very low (e.g., when the temperature sensor 110 is short-circuited).

Figure 8C:
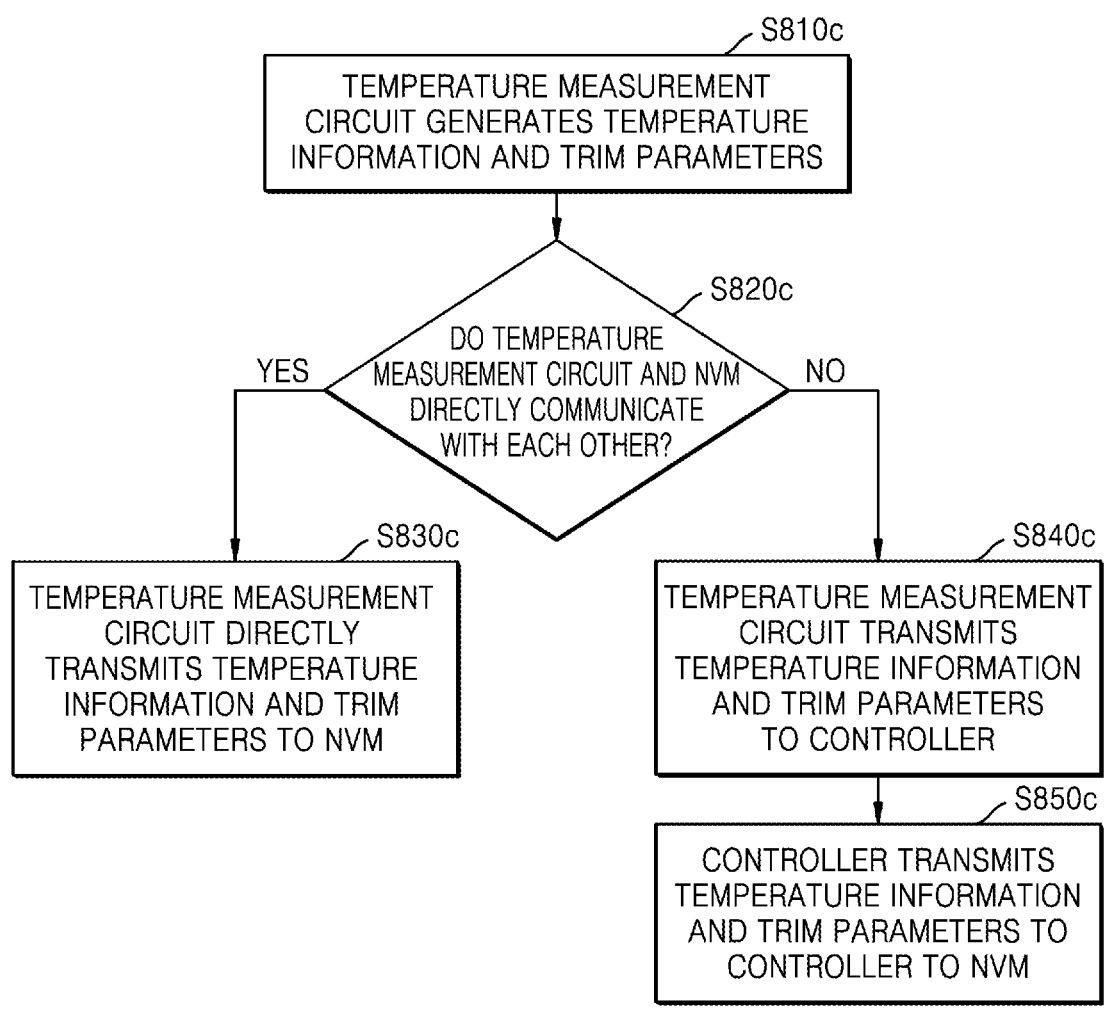
FIG. 8C is a diagram showing an operation process of a temperature measurement circuit according to some embodiments.

FIG. 8C is a diagram showing an operation process of a temperature measurement circuit according to some embodiments.

Referring to FIG. 8C, in operation S810c, the temperature measurement circuit 120 (FIG. 1) may generate temperature information and trim parameters.

In operation S820c, it is determined whether the temperature measurement circuit 120 and the NVM 420 directly communicate with each other. When the temperature measurement circuit 120 and the NVM 420 (FIG. 4B) directly communicate with each other (YES branch from operation S820c), the process may proceed to operation S830c. When the temperature measurement circuit 120 and the NVM 420 (FIG. 4B) do not directly communicate with each other (NO branch from operation S820c), the process may proceed to operation S840c.

In operation S830c, the temperature measurement circuit 120 may directly transmit the temperature information and trim parameters to the NVM 420. The NVM 420 may perform any one command from among erase, read, and program commands received from the controller 410 (FIG. 4A) by using the trim parameters received from the temperature measurement circuit 120.

In operation S840c, the temperature measurement circuit 120 may transmit temperature information and trim parameters to the controller 410 (FIG. 4B). In operation S850c, the controller 410 may transmit temperature information and trim parameters to the NVM 420. The NVM 420 may use the trim parameters received from the controller 410 to perform any one command from among erase, read, and program commands received from the controller 410.

Figure 9:
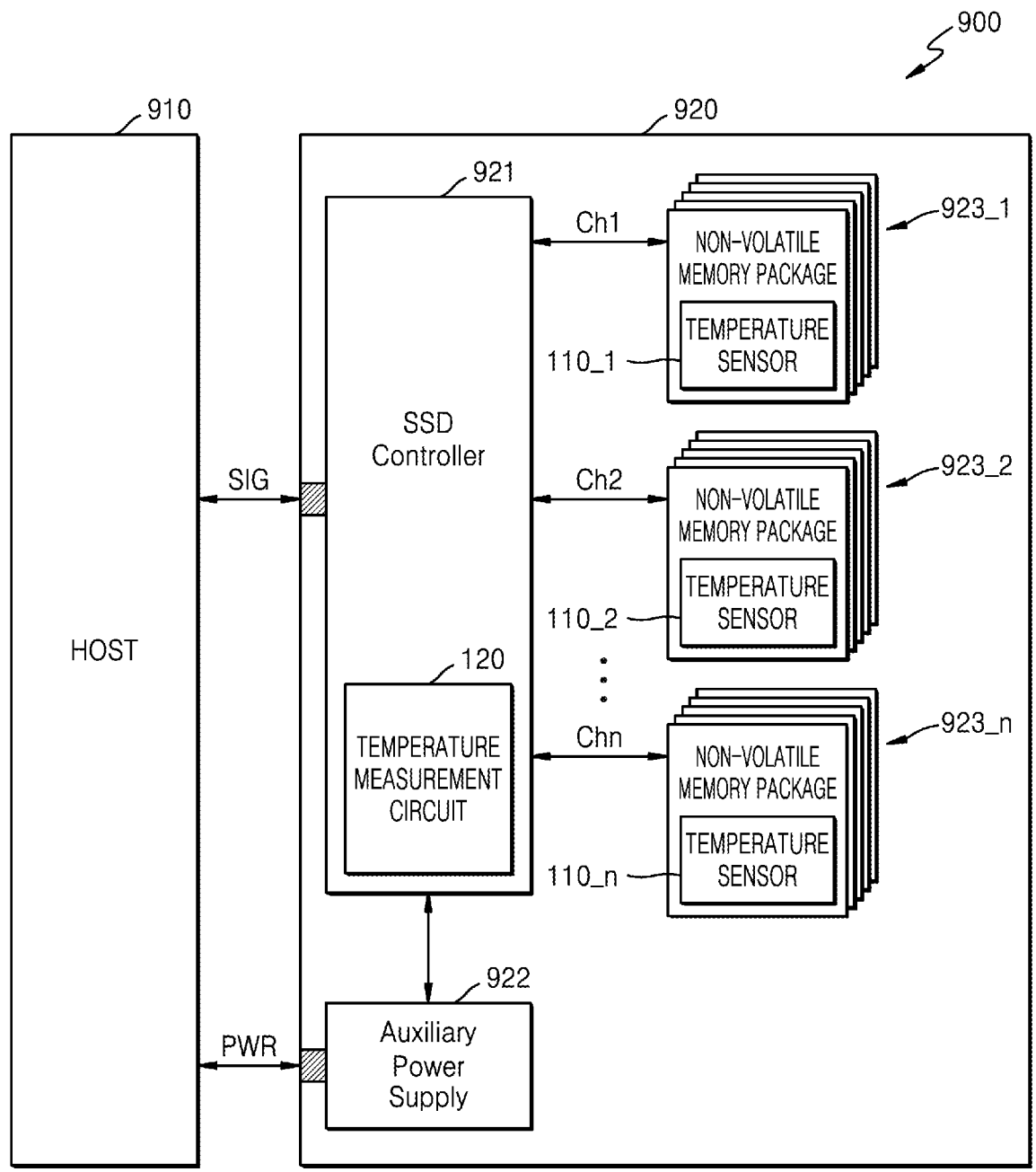
FIG. 9 is a block diagram showing an example in which a temperature detector according to some embodiments is applied to an SSD system.

FIG. 9 is a block diagram showing an example in which a temperature detector according to some example embodiments is applied to an SSD system.

Referring to FIG. 9, an SSD system 900 may include a host 910 and an SSD 920. The SSD 920 may exchange signals SIG with the host 910 through a signal connector and may receive power PWR through a power connector. The SSD 920 may include an SSD controller 921, an auxiliary power supply 922, and non-volatile memory packages 923_1 to 923_n. The non-volatile memory packages 923_1 to 923_n may each include NAND flash memories therein. Here, the SSD 920 may be implemented according to the embodiments described above with reference to FIGS. 1 to 8C. For example, the SSD controller 921 may include the temperature measurement circuit 120 described above (FIG. 1). The non-volatile memory packages 923_1 to 923_n may include temperature sensors 110_1 to 110_n, respectively.

The temperature sensor 110 may be deposited on the first substrate 510 (FIG. 5A). The first substrate 510 may be positioned over the non-volatile memory packages 923_1 to 923_n.

While the inventive concepts have been particularly shown and described with reference to some examples of embodiments thereof, it will be understood that various changes in form and details may be made therein without departing from the scope of the following claims.

What is claimed is:

1. A storage device comprising:
a non-volatile memory configured to store data;
a temperature sensor having a resistance that changes in correspondence to a change in a temperature of the temperature sensor; and
a temperature measurement circuit comprising a plurality of transistors, the plurality of transistors configured to turn on or off based on a current flow from the temperature sensor, each of the plurality of transistors having a different threshold voltage from others of the plurality of transistors, wherein the temperature measurement circuit is configured to generate information indicating the temperature and/or indicating damage to the temperature sensor based on an output current obtained from the plurality of transistors.

2. The storage device of claim 1, wherein the resistance of the temperature sensor has a resistance value that is proportional to the temperature of the temperature sensor, and
wherein the temperature measurement circuit comprises a first N-type transistor having a first threshold voltage and a second N-type transistor having a second threshold voltage lower than that of the first threshold voltage, the temperature measurement circuit configured to generate first temperature information indicating a first temperature based on an output current of the first N-type transistor, and configured to generate second temperature information indicating a second temperature that is higher than the first temperature based on an output current of the second N-type transistor.

3. The storage device of claim 2, wherein the second temperature information comprises bit information regarding the first temperature and bit information regarding the second temperature.

4. The storage device of claim 2, wherein the temperature measurement circuit comprises a third N-type transistor having a third threshold voltage that is lower than the second threshold voltage, and wherein the temperature measurement circuit is configured to generate damage information indicating damage of the temperature sensor based on an output current of the third N-type transistor.

5. The storage device of claim 1, wherein a resistance of the temperature sensor has a resistance value that is inversely proportional to the temperature of the temperature sensor, and wherein the temperature measurement circuit comprises a first P-type transistor connected to the temperature sensor and having a third threshold voltage and a second P-type transistor having a fourth threshold voltage that is lower than the third threshold voltage, wherein the temperature measurement circuit is configured to generate first temperature information indicating a first temperature based on an output current of the first P-type transistor, and is configured to generate second temperature information indicating a second temperature that is higher than the first temperature based on an output current of the second P-type transistor.

6. The storage device of claim 1, further comprising a controller configured to control the temperature measurement circuit and the non-volatile memory, wherein the controller is configured to request temperature information from the temperature measurement circuit, and
   wherein the temperature measurement circuit is configured to measure the resistance value of the temperature sensor by applying a current to the temperature sensor in response to the request for the temperature information.

7. The storage device of claim 6, wherein, when the resistance value of the temperature sensor exceeds a threshold value, the temperature measurement circuit is configured to transmit generated damage information regarding the temperature sensor to the non-volatile memory.

8. The storage device of claim 6, wherein, when the resistance value of the temperature sensor does not exceed a threshold value, the temperature measurement circuit is configured to transmit generated temperature information to the non-volatile memory.

9. The storage device of claim 1, further comprising a printed circuit board (PCB) substrate,
   wherein the temperature sensor is on the PCB substrate.

10. The storage device of claim 9, wherein the temperature sensor comprises deposited nickel, copper, or platinum.

11. The storage device of claim 1, wherein the temperature sensor is on a first substrate, and
   the first substrate is part of a stack structure and is positioned either between the non-volatile memory and a controller or above the non-volatile memory.

12. The storage device of claim 1, further comprising a controller configured to control the temperature measurement circuit and the non-volatile memory wherein the temperature measurement circuit comprises a parameter generator,
   wherein the parameter generator is configured to transmit parameters related to the generated temperature information to the controller,
   wherein the controller is configured to transmit the parameters related to the generated temperature information and any one command from among erase, program, and read to the non-volatile memory, and
   wherein the non-volatile memory is configured to execute a received command based on the parameters related to the generated temperature information.

13. The storage device of claim 1, further comprising a controller configured to control the temperature measurement circuit and the non-volatile memory, wherein the temperature measurement circuit comprises a parameter generator,
   wherein the parameter generator is configured to transmit parameters related to generated temperature information to the non-volatile memory,
   wherein the controller is configured to transmit any one command from among erase, program, and read commands to the non-volatile memory, and
   wherein the non-volatile memory is configured to transmit a received command based on the parameters related to the generated temperature information.

14. A method of operating a storage device including a controller and a non-volatile memory, the method comprising:
   requesting, by the controller, temperature information from a temperature measurement circuit;
   measuring, by the temperature measurement circuit, a resistance of a temperature sensor having a resistance that changes according to a temperature of the temperature sensor, resulting in a measured resistance value;
   generating, by the temperature measurement circuit and based on the measured resistance value, temperature information indicating the temperature of the temperature sensor and/or damage information indicating damage to the temperature sensor, the generating comprising using a plurality of transistors having different threshold voltages from one another; and
   transmitting, by the temperature measurement circuit, the generated temperature information and/or the generated damage information to the non-volatile memory or the controller.

15. The method of claim 14, wherein, in the generating of the temperature information and/or the damage information, the temperature measurement circuit generates the damage information when the measured resistance value exceeds a threshold value and generates the temperature information when the measured resistance value does not exceed the threshold value.

16. The method of claim 14, further comprising:
   transmitting, by the temperature measurement circuit, parameters related to the generated temperature information to the controller;
   transmitting, by the controller, the parameters related to the generated temperature information and an erase command, a program command, or a read command to the non-volatile memory; and
   executing, by the non-volatile memory, the erase command, program command, or read command based on the parameters related to the generated temperature information.

17. The method of claim 14, further comprising:
   transmitting, by the temperature measurement circuit, parameters related to the generated temperature information to the non-volatile memory;
   transmitting, by the controller, an erase command, a program command, or a read command to the non-volatile memory; and
   executing, by the non-volatile memory, the erase command, program command, or read command based on the parameters related to the generated temperature information.

18. A solid state disk (SSD) comprising:
   a semiconductor package comprising a non-volatile memory configured to store data and a temperature sensor having a resistance that changes according to a temperature of the temperature sensor; and
   a SSD controller,
   wherein the SSD controller is configured to control the semiconductor package and comprises a temperature measurement circuit, and wherein the temperature measurement circuit comprises a plurality of transistors, which are configured to turn on or off based on a current flow of the temperature sensor, the plurality of transistors having different threshold voltages from one another, and wherein the temperature measurement circuit is configured to apply a current to the temperature sensor and to generate information indicating the temperature of the temperature sensor or indicating damage to the temperature sensor based on an output current obtained from the plurality of transistors.

19. The SSD of claim 18, wherein the temperature sensor is on a first substrate, and
wherein the first substrate is attached onto the non-volatile memory.

20. The SSD of claim 19, wherein the temperature sensor is deposited on the first substrate through any one of physical vapor deposition (PVD), chemical vapor deposition (CVD), and atomic layer deposition (ALD).

* * * * *